US008623231B2

United States Patent
Liu et al.

(10) Patent No.: US 8,623,231 B2
(45) Date of Patent: Jan. 7, 2014

(54) METHOD FOR ETCHING AN ULTRA THIN FILM

(75) Inventors: George Liu, Shin-Chu (TW); Kuei Shun Chen, Hsin-Chu (TW); Vencent Chang, Hsinchu (TW); Chih-Yang Yeh, Jhubei (JP)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1084 days.

(21) Appl. No.: 12/137,186

(22) Filed: Jun. 11, 2008

(65) Prior Publication Data

US 2009/0311628 A1 Dec. 17, 2009

(51) Int. Cl.
| | | |
|---|---|---|
| *H01L 21/302* | (2006.01) | |
| *H01L 21/461* | (2006.01) | |
| *C03C 15/00* | (2006.01) | |
| *C03C 25/68* | (2006.01) | |
| *C25F 3/00* | (2006.01) | |

(52) U.S. Cl.
USPC .............. 216/83; 216/95; 216/96; 438/745; 438/749; 438/754; 438/756; 438/757

(58) Field of Classification Search
None
See application file for complete search history.

(56) References Cited

U.S. PATENT DOCUMENTS

| | | | | |
|---|---|---|---|---|
| 4,160,691 | A * | 7/1979 | Abolafia et al. | 216/108 |
| 6,498,059 | B2 * | 12/2002 | Chen et al. | 438/151 |
| 6,815,353 | B2 * | 11/2004 | Schlupp et al. | 438/691 |
| 7,008,878 | B2 | 3/2006 | Hsu et al. | |
| 2004/0229461 | A1 * | 11/2004 | Darsillo et al. | 438/689 |
| 2005/0173669 | A1 * | 8/2005 | Kurata et al. | 252/79.1 |
| 2007/0020836 | A1 * | 1/2007 | Moon et al. | 438/198 |

FOREIGN PATENT DOCUMENTS

CN 1901169 1/2007

* cited by examiner

*Primary Examiner* — Nadine G. Norton
*Assistant Examiner* — Stephanie Duclair
(74) *Attorney, Agent, or Firm* — Haynes and Boone, LLP

(57) ABSTRACT

A method for etching an ultra thin film is provided which includes providing a substrate having the ultra thin film formed thereon, patterning a photosensitive layer formed over the ultra thin film, etching the ultra thin film using the patterned photosensitive layer, and removing the patterned photosensitive layer. The etching process includes utilizing an etch material with a diffusion resistant carrier such that the etch material is prevented from diffusing to a region underneath the photosensitive layer and removing portions of the ultra thin film underneath the photosensitive layer.

17 Claims, 3 Drawing Sheets

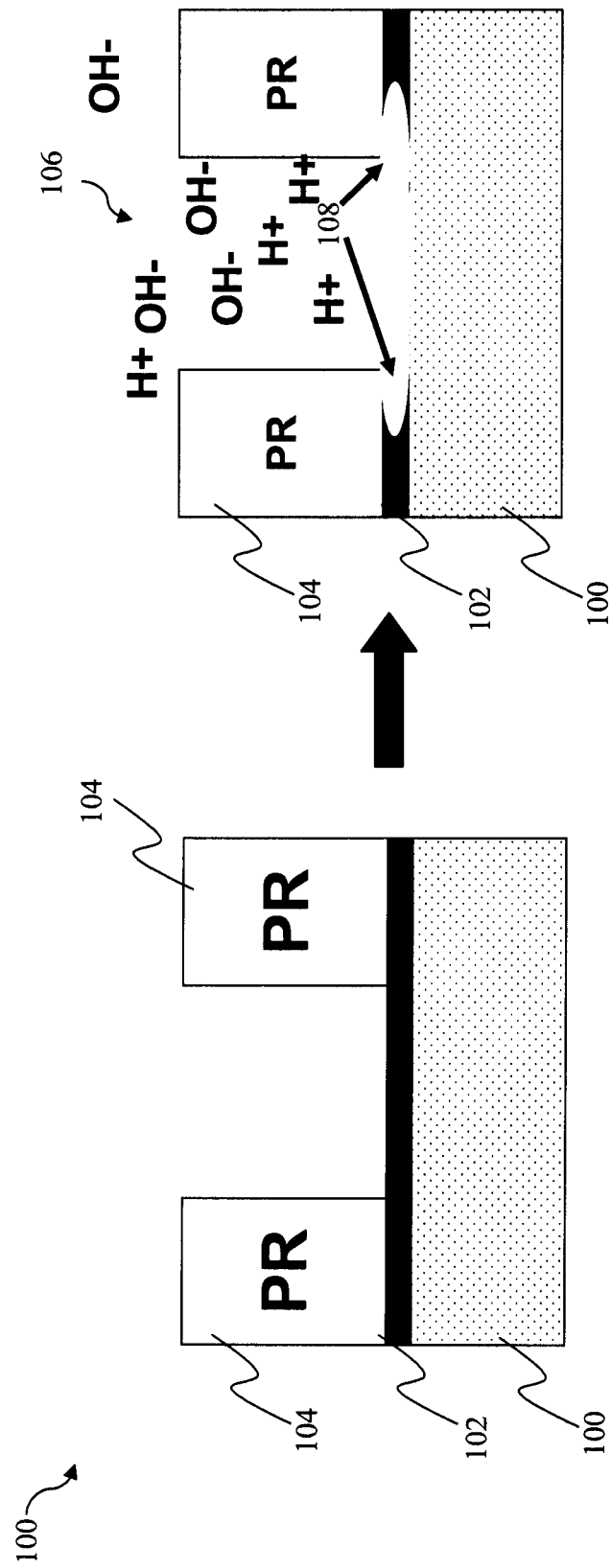

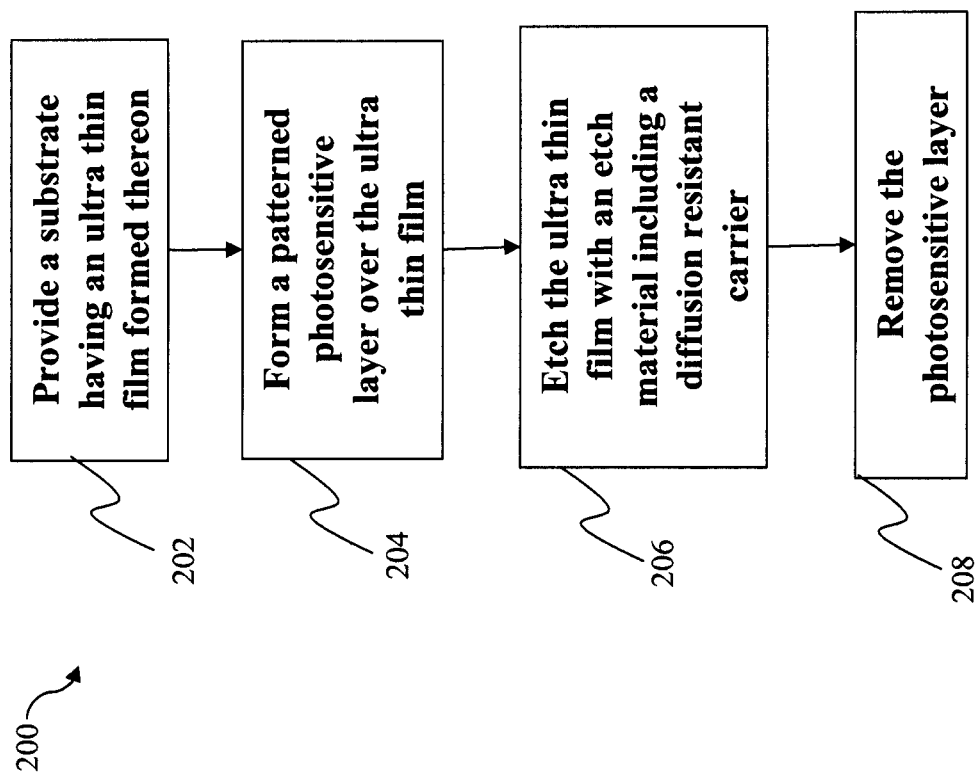

METHOD FOR ETCHING AN ULTRA THIN FILM

BACKGROUND

The present disclosure relates generally to semiconductor manufacturing and, more particularly, to a method for etching an ultra thin film in semiconductor manufacturing.

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. For example, current fabrication processes are producing semiconductor devices with 45 nm process technology and beyond. However, the reduction in size of device geometries frequently introduces new challenges that need to be overcome.

As semiconductor devices are scaled down, various ultra thin films having a thickness of less than 100 Angstroms have been employed. For example, ultra thin $SiO_2$ gate oxide dielectric films may be used in semiconductor devices, such as metal oxide semiconductor field effect transistors (MOSFETs) and complementary metal-oxide-semiconductor (CMOS) devices. However, current techniques for patterning ultra thin films have not been satisfactory in all respects. In particular, it has been increasingly difficult to control the etching of ultra thin films without causing lateral etching of the ultra thin film underneath a photoresist layer. Accordingly, patterns formed in the ultra thin film may vary and be distorted which can lead to various problems such as poor device performance and low yield.

Therefore, a need exists for a simple and cost-effective method for etching an ultra thin film in semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A and 1B are cross-sectional views of a substrate having an ultra thin film being processed by a conventional etching process;

FIG. 2 is a flowchart of a method for etching an ultra thin film according to various aspects of the present disclosure.

DETAILED DESCRIPTION

Figure 3B:
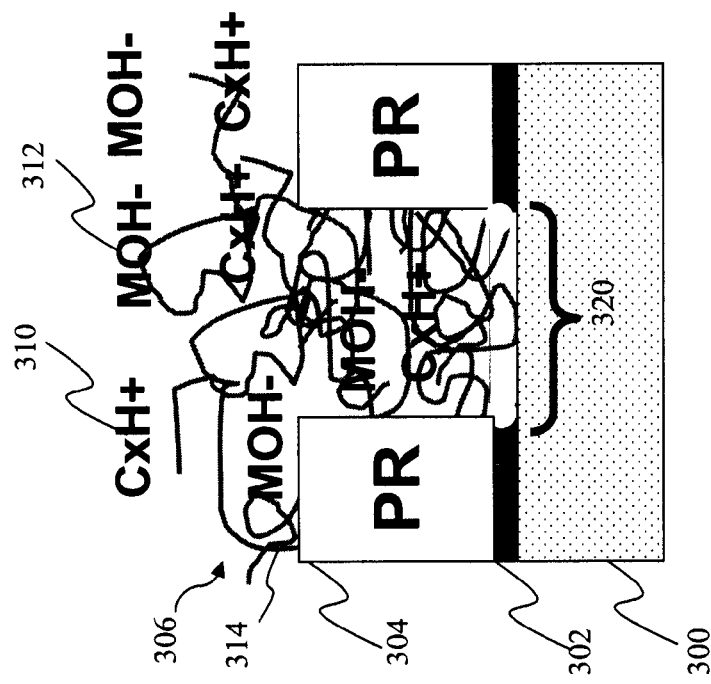
FIGS. 3A and 3B are cross-sectional views of a substrate having an ultra thin film being processed by the method of FIG. 2.

The present disclosure relates generally to semiconductor manufacturing and more particularly, to a method for etching an ultra thin film in semiconductor manufacturing. It is understood, however, that specific embodiments are provided as examples to teach the broader inventive concept, and one of ordinary skill in the art can easily apply the teaching of the present disclosure to other methods or devices. In addition, it is understood that the methods and apparatus discussed in the present disclosure include some conventional structures and/or processes. Since these structures and processes are well known in the art, they will only be discussed in a general level of detail.

Furthermore, reference numbers are repeated throughout the drawings for sake of convenience and example, and such repetition does not indicate any required combination of features or steps throughout the drawings. Moreover, the formation of a first feature over, on, adjacent, abutting, or coupled to a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, including for example, etching a substrate, may include embodiments where features are formed above the surface of the substrate, directly on the surface of the substrate, and/or extending below the surface of the substrate (such as, trenches).

Referring to FIGS. 1A and 1B, illustrated are cross-section views of a substrate 100 having an ultra thin film 102 being processed with a conventional etching process. In FIG. 1A, the substrate 100 may include semiconductor substrate such as a silicon in a crystalline structure. The substrate 100 may further include one or more layers formed on the substrate. Examples of layers that may be formed include doped layers, insulative layers, epitaxial layers, conductive layers including polysilicon layers, dielectric layers, and/or other suitable semiconductor layers.

The ultra thin film 102 may be formed on the substrate 100 by various techniques known in the art. The ultra thin film 102 may have a thickness that is less than 100 Angstrom. The ultra thin film 102 may include a dielectric material or conductive material. A photoresist layer 104 may be formed on the ultra thin film 102, and may be patterned by photolithography or other suitable process known in the art. In FIG. 1B, the ultra thin film 102 may be etched using the patterned photoresist layer 104. The etch process may include a wet etch process using an etch chemical 106 such as an acidic or basic solution depending on the type of material being etched as well as other factors such as etch selectivity and etch rate. However, the small molecules of the etch chemical 106 may erode 108 the ultra thin film 102 underneath the photosensitive layer 104 due to capillary action. That is, the small molecules of the etch chemical 106 may be drawn to and may diffuse to a region 108 underneath the photoresist, and laterally etch a portion of the ultra thin film 102. Accordingly, it may be difficult to control the etch rate, and the pattern formed in the ultra thin film 102 may be distorted which can lead various problems such as poor device performance. The unintentional lateral etching of ultra thin films may be magnified as pattern features continue to be scaled down for patterning technologies below 32 nm node.

Figure 3A:
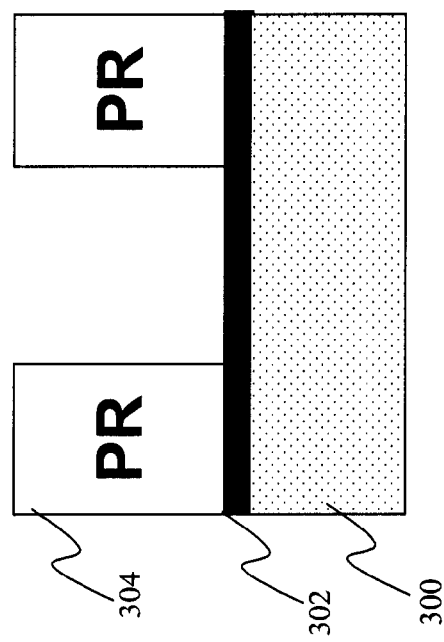

Referring to FIG. 2, illustrated is a flowchart for a method 200 for etching an ultra thin film. Also referring to FIGS. 3A and 3B, illustrated are cross-section views of a ultra thin film being etch according to the method 200 of FIG. 2. The method 200 begins with block 202 in which a substrate 300 having an ultra thin film 302 formed thereon is provided. In FIG. 3A, the substrate 300 may include silicon in a crystalline structure. In alternative embodiments, the substrate 300 may optionally include other elementary semiconductors such as germanium, or may include a compound semiconductor such as, silicon carbide, gallium arsenide, indium arsenide, or indium phosphide. Additionally, the substrate 300 may include a silicon on insulator (SOI) substrate, polymer-on-silicon substrate, or "silicon-on-nothing" ("SON") substrate including a thin insulation layer. The thin insulation layer includes air and/or other gaseous composition. The substrate 300 may further comprise one or more layers formed on the substrate. Examples of layers that may be formed include doped layers, insulative layers, epitaxial layers, conductive layers including polysilicon layers, dielectric layers, and/or other suitable semiconductor layers.

The ultra thin film 302 may be formed on the substrate 300 by various techniques. For example, the ultra thin film 302 may include a silicon dioxide (SiO2) that is deposited by a low pressure chemical vapor deposition (LPCVD) or plasma enhanced chemical vapor deposition (PECVD) process using, for example, tetraethylorthosilicate (TEOS) and ozone ($O_3$) or silane and oxygen. Alternatively, the ultra thin film 302 may be formed by physical vapor deposition (PVD or sputtering), chemical vapor deposition (CVD), atmospheric pressure CVD (APCVD), high density plasma CVD (HD-PCVD), atomic layer CVD (ALCVD), and/or other processes known in the art. Preferably, the ultra thin film 302 may be formed with a thickness less than about 100 Angstrom. Alternatively, the ultra thin film 302 may include other materials such as silicon nitrides, silicon oxynitrides (e.g., SiON, $SiO_xN_y$), metal oxides (e.g., ZnO, NiO, SnO, or other Meta-$lO_x$), organic materials, metals (e.g., Al, Cr, Cu, Fe, Pb, Ni, Sn, Pt, Ti, Zn, etc.), and low-k dielectric materials (e.g., fluorinated silica glass (FSG), carbon doped silicon oxide, Black Diamond® (Applied Materials of Santa Clara, Calif.)).

The method 200 continues with block 204 in which a patterned photosensitive layer 304 may be formed on the ultra thin film 302. The photosensitive layer 304 may include a photoresist such as a chemical amplification resist (CAR). The photosensitive layer 304 may be formed by a spin-on process, a deposition process, and/or other suitable process. The photosensitive layer 304 may be patterned by a photolithography process, immersion photolithography process, or other lithography processes. The pattern photosensitive layer 304 may be used to form one or more features such as gates, interconnects, vias, and contacts in the ultra thin film 302.

The method 200 continues with block 206 in which the ultra thin film 302 may be etched using the patterned photosensitive layer 304. The etching process includes a wet etch process (high etch selectivity) using an etch mixture 306 that includes an etch chemical 310, 312 and a high diffusion resistant carrier 314. The etch chemical 310, 312 may be carried in a liquid base such as $H_2O$ or other solvent, and the viscosity of the solvent may be modified to reduce the chemical diffusion velocity of the etch mixture 306 including the etch chemical. For example, the viscosity of the solvent may be increased by providing larger molecules such as glycerine ($C_3H_5(OH)_3$), or other suitable chemical compounds, and a colloid or polymer material may be formed having a low rate of diffusion. Accordingly, diffusion of the etch mixture 306 may be controlled within a region 320 such that the etch chemical 310, 312 may be prevented from diffusing underneath the photosensitive layer 304 and removing portions of the ultra thin film 302 underneath the photosensitive layer. Therefore, one can better control the etch rate and the etching process using the etch mixture 306 for ultra thin films.

The etch chemical 310, 312 may include an etch chemical having large molecules. For example, the etch chemical 310 (CxH+) may include an organic acid group such as oxalic acid ($H_2C_2O_4$), lauric acid ($C_{12}H_{24}O_2$), hexanedioic acid (HOOC($C_2H_4$)COOH or $C_6H_{10}O_4$), and benzoic acid ($C_7H_6O_2$ or $C_6H_5COOH$). Accordingly, the organic compound may release large molecules containing more than two atoms such as $C_6H_5COO$—. Further, the organic acid group may include, for example, other carboxylic acids with —COOH group, and acids with —$SO_3H$ group. Also, the etch chemical 312 (MOH—) may include a base group such as an alkali including sodium hydroxide (NaOH), potassium hydroxide (KOH), and ammonium hydroxide ($NH_4OH$) or ammonium cation. Alternatively, the etch chemical may optionally include one of an inorganic acid group, an alkali, an organic alkali, and an alkyl chain. The etch chemical that is selected will depend on the type of film that is to be etched. The inorganic acid group may include, for example, nitric acid ($HNO_3$), sulfuric acid ($H_2SO_4$), and hydrochloric acid (HCl). The organic alkali may include, for example, tetra-methylammonium hydroxide (TMAH). The alkyl chain may include, for example, methyl ($CH_3$), ethyl ($C_2H_5$), propyl ($C_3H_7$), etc.

The method 200 continues with block 208 in which the photosensitive layer 304 is removed by a process known in the art, and the substrate 300 may undergo further processing to fabricate a semiconductor device.

Thus, provided is a method for etching an ultra thin film that includes providing a substrate having the ultra thin film formed thereon, patterning a photosensitive layer formed over the ultra thin film, etching the ultra thin film using the patterned photosensitive layer, and removing the patterned photosensitive layer. The etching process includes utilizing an etch material with a diffusion resistant carrier such that the etch material is prevented from diffusing to a region underneath the photosensitive layer and removing portions of the ultra thin film underneath the photosensitive layer. In some embodiments, the etch material includes one of an inorganic acid group, an organic acid group, an alkali, an organic alkali, and an alkyl chain. In some other embodiments, the inorganic acid group includes one of a nitric acid, sulfuric acid, and hydrochloric acid. In other embodiments, the organic acid group includes one of an oxalic acid, lauric acid, hexanedioic acid, and benzoic acid. In some other embodiments, the alkali includes one of a sodium hydroxide, potassium hydroxide, and ammonium cation.

In still other embodiments, the organic alkali includes tetra-methylammonium hydroxide (TMAH). In some embodiments, the diffusion resistant carrier includes a solvent and glycerine mixture. In other embodiments, the method further includes depositing the ultra thin film with a thickness that is less than 100 Angstroms. In still other embodiments, the substrate includes a silicon substrate. In some other embodiments, the ultra thin film is of a type selected from the group consisting of: silicon dioxide, silicon nitride, silicon oxynitride, metal oxide, organic material, metal material, and low-k dielectric material.

Also provided is an etch material that includes an etch chemical that is selected from the group consisting of: an inorganic acid group, an organic acid group, an alkali, an organic alkali, and an alkyl chain, and a carrier solvent for carrying the etch chemical, the carrier solvent being configured as a diffusion resistant carrier solvent. In some embodiments, the inorganic acid group includes one of a nitric acid, a sulfuric acid, and a hydrochloric acid. In other embodiments, the organic acid group includes one of an oxalic acid, a lauric acid, a hexanedioic acid, and a benzoic acid. In some other embodiments, the alkali includes one of a sodium hydroxide, a potassium hydroxide, and an ammonium cation. In still some other embodiments, the organic alkali includes tetra-methylammonium hydroxide (TMAH). In other embodiments, the carrier solvent includes glycerine.

Additionally, a method for etching an ultra thin film is provided which includes providing a semiconductor substrate having an ultra thin film formed thereon, the ultra thin film having a thickness less than about 100 Angstrom; forming a patterned photoresist layer over the ultra thin film, the patterned photoresist layer having an opening that exposes a portion of the ultra thin film; and etching the exposed portion of the ultra thin film with an etch material that includes an etch chemical in a diffusion resistant carrier, wherein the etch material resists from diffusing to a region underneath the photoresist layer and removing unexposed portions of the ultra thin film. In some embodiments, the etch material is one of a colloid material and a polymer material. In other embodiments, the etch chemical is configured to release molecules having more than two atoms. In some other embodiments, the diffusion resistant carrier includes a solvent and a glycerine mixture.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

Several different advantages exist from these and other embodiments. The methods and etch materials disclosed herein provide a simple and cost-effective technique for controlling the etching of various ultra thin films used in semiconductor devices. Accordingly, the uniformity of patterns formed in the ultra thin films will be improved, and thus enhancing device performance and reliability. Further, the methods and etch materials disclosed herein can be easily integrated with semiconductor manufacturing processes, and may be used to fabricate next generation devices using patterning technologies for 32 nm node and beyond.

What is claimed is:

1. A method for etching an ultra thin film, comprising:
providing a substrate having the ultra thin film formed thereon, the ultra thin film having a thickness less than about 100 Angstrom;
patterning a photosensitive layer formed over the ultra thin film;
etching the ultra thin film with the patterned photosensitive layer to form a pattern in the ultra thin film;
removing the photosensitive layer after etching the ultra thin film;
wherein the etching includes utilizing an etch material with a diffusion resistant carrier so that the etch material is prevented from diffusing to a region underneath the photosensitive layer and removing portions of the ultra thin film underneath the photosensitive layer, the etch material including a first chemical having an organic acid and a second chemical having a metal hydroxide and the diffusion resistant carrier includes a solvent and a glycerine mixture.

2. The method of claim 1, wherein the organic acid includes one of an oxalic acid, lauric acid, hexanedioic acid, and benzoic acid.

3. The method of claim 1, further including depositing the ultra thin film with the thickness that is less than 100 Angstroms.

4. The method of claim 1, wherein the substrate includes a silicon substrate.

5. The method of claim 1, wherein the ultra thin film is of a type selected from the group consisting of: silicon dioxide, silicon nitride, silicon oxynitride, metal oxide, organic material, metal material, and low-k dielectric material.

6. A method for etching an ultra thin film formed over a substrate, the method comprising:
providing a semiconductor substrate having an ultra thin film formed thereon, the ultra thin film having a thickness less than about 100 Angstrom;
forming a patterned photoresist layer on the ultra thin film, the patterned photoresist layer having an opening that exposes a portion of the ultra thin film; and
etching the exposed portion of the ultra thin film with an etch material to form a pattern in the ultra thin film, the etch material includes an etch chemical in a diffusion resistant carrier, wherein the etch material resists from diffusing to a region underneath the photoresist layer and removing unexposed portions of the ultra thin film, the etch material including a first chemical having an organic acid and a second chemical having a metal hydroxide and the diffusion resistant carrier includes a solvent and a glycerine mixture.

7. The method of claim 6, wherein the etch chemical is configured to release molecules having more than two atoms.

8. The method of claim 6, wherein the organic acid includes one of an oxalic acid, lauric acid, and hexanedioic acid.

9. The method of claim 6, wherein the substrate includes a silicon substrate.

10. The method of claim 6, wherein the ultra thin film is of a type selected from the group consisting of: silicon dioxide, silicon nitride, silicon oxynitride, metal oxide, organic material, and low-k dielectric material.

11. A method for etching an ultra thin film, comprising:
providing a substrate having the ultra thin film formed thereon, the ultra thin film having a thickness less than about 100 Angstrom;
patterning a photosensitive layer formed over the ultra thin film;
etching the ultra thin film with the patterned photosensitive layer to form a pattern in the ultra thin film;
removing the photosensitive layer after etching the ultra thin film;
wherein the etching includes utilizing an etch material with a diffusion resistant carrier so that the etch material is prevented from diffusing to a region underneath the photosensitive layer and removing portions of the ultra thin film underneath the photosensitive layer, the etch material including a first chemical having an organic acid and a second chemical having one of an inorganic acid group, an organic acid group, an alkali, an organic alkali, and an alkyl chain, wherein the diffusion resistant carrier includes a solvent and a glycerine mixture.

12. The method of claim 11, wherein the inorganic acid group includes one of a nitric acid, sulfuric acid, and hydrochloric acid.

13. The method of claim 11, wherein the organic acid group includes one of an oxalic acid, lauric acid, hexanedioic acid, and benzoic acid.

14. The method of claim 11, wherein the alkali includes one of a sodium hydroxide, potassium hydroxide, and ammonium cation.

15. The method of claim 11, wherein the organic alkali includes tetra-methylammonium hydroxide (TMAH).

16. The method of claim 11, wherein the diffusion resistant carrier includes a solvent and glycerine mixture.

17. The method of claim 11, wherein the etch chemical is configured to release molecules having more than two atoms.

* * * * *